United States Patent [19]
Ahn et al.

[11] Patent Number: 6,064,619
[45] Date of Patent: May 16, 2000

[54] SYNCHRONOUS DYNAMIC RANDOM ACCESS MEMORY IN A SEMICONDUCTOR MEMORY DEVICE

[75] Inventors: Seung Han Ahn; Jae Jin Lee, both of Ichon-shi, Rep. of Korea

[73] Assignee: Hyundai Electronics Industries Co., Ltd., Ichon-shi, Rep. of Korea

[21] Appl. No.: 09/106,308

[22] Filed: Jun. 29, 1998

[30] Foreign Application Priority Data

Jun. 30, 1997 [KR] Rep. of Korea ..................... 97-30229

[51] Int. Cl.[7] .................................................. G11C 8/00
[52] U.S. Cl. ................... 365/230.03; 365/230.08
[58] Field of Search .............................. 365/230.03, 233, 365/226, 189.05, 193, 222, 230.08

[56] References Cited

U.S. PATENT DOCUMENTS

| | | |
|---|---|---|
| 5,384,745 | 1/1995 | Konishi et al. ..................... 365/230.03 |
| 5,404,338 | 4/1995 | Murai et al. ............................. 365/233 |
| 5,566,108 | 10/1996 | Kitamura ................................. 365/233 |
| 5,636,173 | 6/1997 | Schaefer ............................. 365/230.03 |

*Primary Examiner*—A. Zarabian
*Attorney, Agent, or Firm*—Nath & Associates; Gary M. Nath; Gregory B. Kang

[57] ABSTRACT

This invention relates to a synchronous dynamic random access memory in a semiconductor memory device, and particularly to a SDRAM in which a user can program a two (2) bank option or a four (4) bank option using an external signal so that it is possible to select one or more banks. An input section receives an external signal, an operation mode section stores an output signal from the input section, and a bank transformation section selects one or more banks using an output signal from the operation mode memory section. When adapted to a SDRAM, it is possible to operate a circuit having banks of different number from each other using an identical design.

15 Claims, 7 Drawing Sheets

SYNCHRONOUS DYNAMIC RANDOM ACCESS MEMORY IN A SEMICONDUCTOR MEMORY DEVICE

FIELD OF THE INVENTION

This invention relates to a synchronous dynamic random access memory (hereinafter, referred to as a SDRAM) in a semiconductor memory device. In particular, it relates to a SDRAM where a user can program two (2) bank options or four (4) bank options using an external signal by changing the conventional metal option, fuse option or bonding option to a mode register; thus, allowing it to be possible to transform to a circuit having different number from each other.

DESCRIPTION OF A RELATED PRIOR ART

In general, means of bank uses when saying the unit that row address operates is independently acted in a DRAM or a system using a DRAM. That is, one row address only operates in one bank.

In case of a conventional DRAM, one row active operation is possible in one chip. Therefore, one chip is identical bank in whole, that is, to one (1) bank. In fact, a bank is equal to or larger than a chip in terms of a scale. A SDRAM has two of the above banks.

In addition, a SDRAM operates in multi bank means that one chip can divide into multiple regions each of which can independently operate. For example, in case of consisting of two banks, it is possible that one chip can divide into two independent regions that can independent row active operation.

In a DRAM, it is impossible to perform the independent row active operation. That is, a row active that is operating is precharged and the row active operation to be selected must be acted to act the row active operation since /RAS is the only one. Since a SDRAM consists of multi banks, another bank can be active without pre-charge of a bank that is currently in an active state. Multi banks are capable of multi-row active operations and pre-charge operations.

Next, in process of operating a system, there is a case in that a memory device having two banks is compatible or a memory device having four (4) banks or eight (8) banks are compatible.

In this state, there are some methods of making such a group of products which use an identical design. Furthermore, a metal layer option method to manufacture product is available, where the number of banks differs by transforming a specific layer to other layer in a method of manufacturing a semiconductor device. There is also a bonding option method to accomplish product where the number of banks differs by changing the connection state when in the process of making a package.

Option specification of such a product can modify the manufacturing process. However, there is a limitation in that it cannot adapt to products since it is impossible for the user to accomplish products having a different option specification.

In the initial steps of product development, it is necessary to transform one chip to different products when inspecting characteristics of various products and when comparing these characteristics. However, it is impossible to make various products using one product.

SUMMARY OF THE INVENTION

Therefore, the first object of the present invention is to provide a synchronous memory device where the operation mode information stores on an operation mode memory device and relates to the modification of a product. Thus, changes in the product standard can access via a program process stored in a mode resistor from outside, in which the operation mode memory device is constructed in a memory device that can adjust a products standard such as number of banks by the previous process.

A second object of the present invention is to provide a synchronous memory device that can allow storage of number of banks to the enable user to select a circuit having banks of different number from each other by programming two banks or four banks in an operation mode memory device which is constructed in a device using an external signal.

To achieve the above object, a synchronous memory device in a semiconductor memory device according to the present invention comprises of: input means for receiving an external signal; operation mode memory means for latching and outputting an output signal by input means in response to the input of an operation mode signal; and bank control means for transforming to a device having banks of different number from each other using an output signal of the operation mode memory means.

A synchronous memory device of the present invention comprises of: input means for receiving an external signal; operation mode memory means for latching and outputting an output signal by input means in response to the input of an operation mode signal; and data width control means for controlling the number of data being input and output at the same time using an output signal of the operation mode memory means.

A synchronous memory device of the present invention comprises of: input means for receiving an external signal; operation mode memory means for latching and outputting an output signal by input means in response to the input of an operation mode signal; and refresh cycle control means for controlling the number of refresh cycle in whole cell during refresh operation using an output signal of the operation mode memory means.

BRIEF DESCRIPTION OF THE DRAWINGS

For a full understanding of the nature and objects of the present invention, reference should be made to the following detailed descriptions in conjunction with the accompanying drawings in which.

Similar reference characters refer to similar parts through the several views of the drawings.

DETAILED DESCRIPTION OF THE INVENTION

This invention will be explained with reference to attached drawings.

In a burst mode among an operation mode of a synchronous memory device in the specification, number of the continous international intermational operation is referred to as a burst length, time that a signal is delayed from an input to an output is referred to as a cas latency, a conventional mode is referred to as a normal mode, and a mode that can program number of banks, data width and a refesh cycle from the outside is referred to as a special mode.

Figure 1:
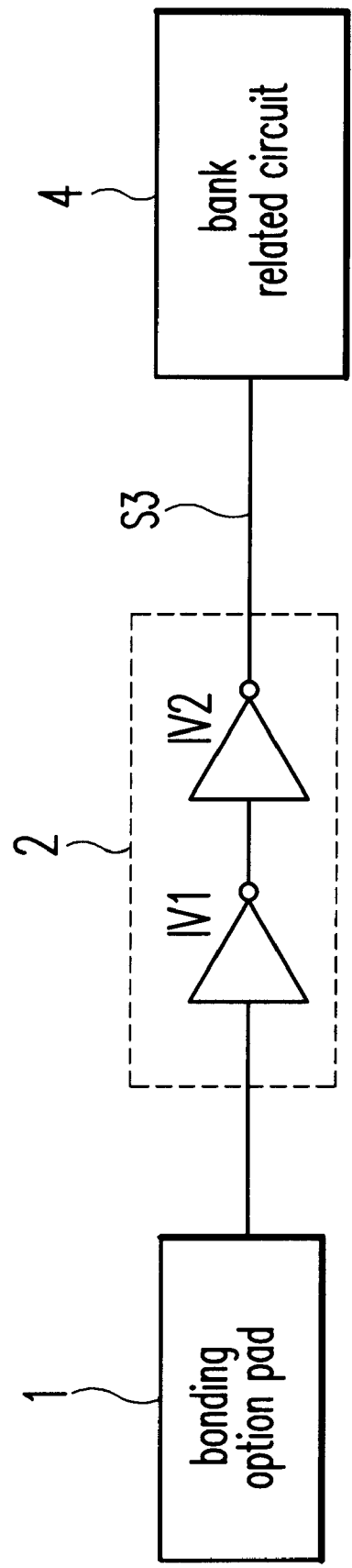
FIG. 1 is a block diagram related to bonding selection according to the prior art.

Fig. 1 illustrates a circuit for the option process. It has a bonding option pad 1 to bond in the package process; connected to the bonding option pad 1 to generate an option signal by which products being different from each other can be accomplished, the option logic circuit 2 having at least one inverter, and a bank related circuit 4 receiving a bank transformation control signal 53 so that operation of a bank is controlled using an output signal of the option logic circuit 2.

The option logic control circuit 2 enables a bonding option pad 1 to change the number of banks. The option pad 1 is connected to a power supply source or a ground so that the option pad 1 has a specific value or no specific value in the initial state. In FIG. 1, the option logic circuit 2 can generate a signal to control the number of banks. For example, if the name of a bank control signal is opt-bank ×2 and this signal is at high state, the opt-bank ×2 is a signal to be operated with two banks, while when this signal is at low state, the opt-bank ×2 is a signal to be operated with four banks.

When a bank transformation control signal 53 receives the bank signal, the signal operates with four banks (the opt-bank ×2 is low state). It is input from the bonding option pad 1, and can operate the four banks which are independent from each other since two addresses is input to select a bank from the outside.

While, in the case of inputting a signal to operate with two banks (the opt-bank ×2 is high state), one of the two banks selection signals which have been used to operate four banks is used in the bank selection, whereby, it is possible to independently perform two row active operations. Addresses which had not been selected during a two bank operation are used as row addresses, or as row addresses and column addresses, or as column addresses only.

Figure 2:
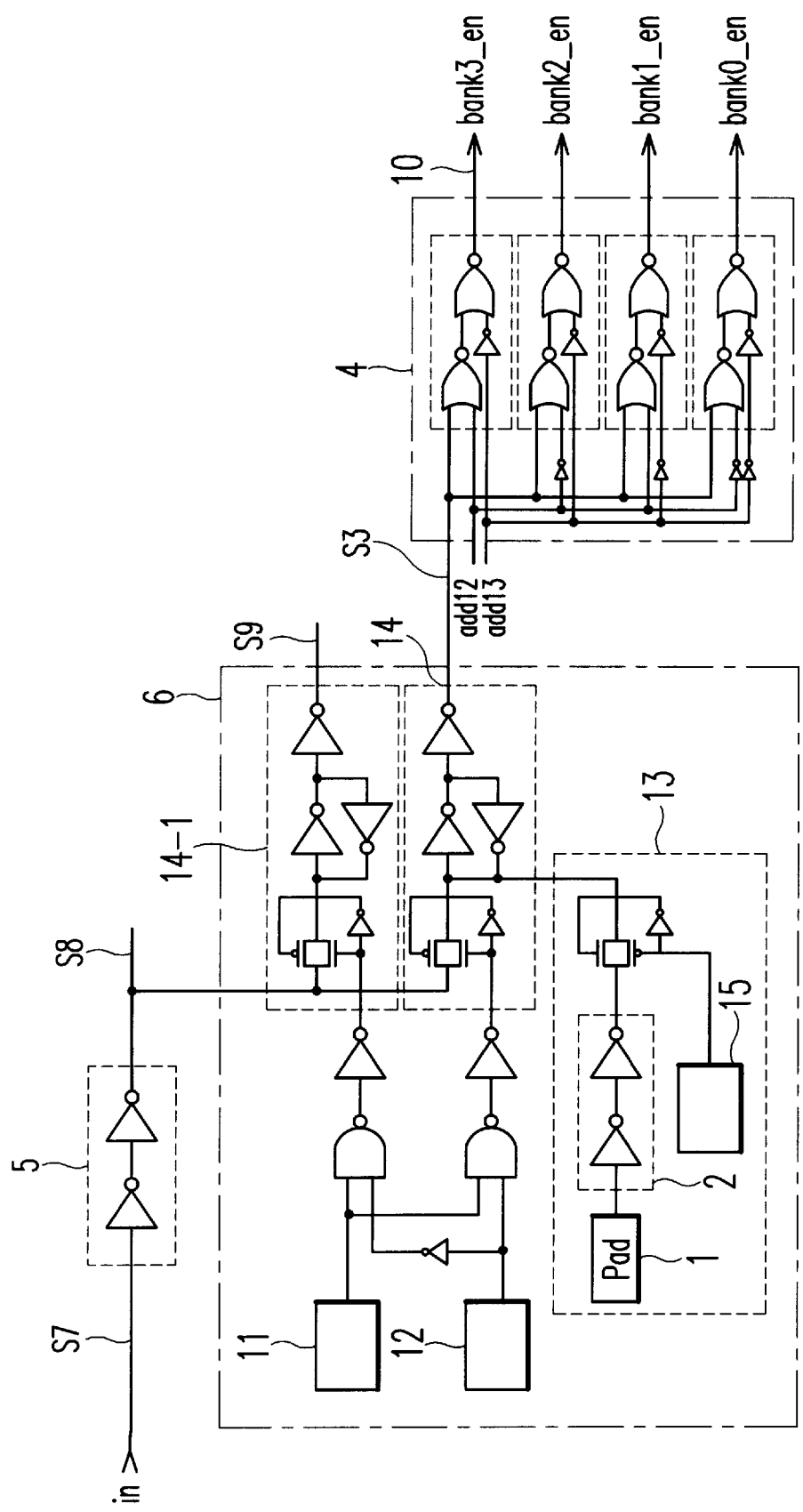
FIG. 2 is a bank selection circuit according to the first embodiment of the present invention.

FIG. 2 illustrates a synchronous memory device according to a first embodiment of the present invention which consists of an external signal input device and a bank relation circuit. The external signal input device is an address buffer 5. An operation mode memory device 6 memories a bank transformation signal (S8) which is input through the external signal input device (5), in which the signal is used to control the bank related circuit 4.

Figure 3:
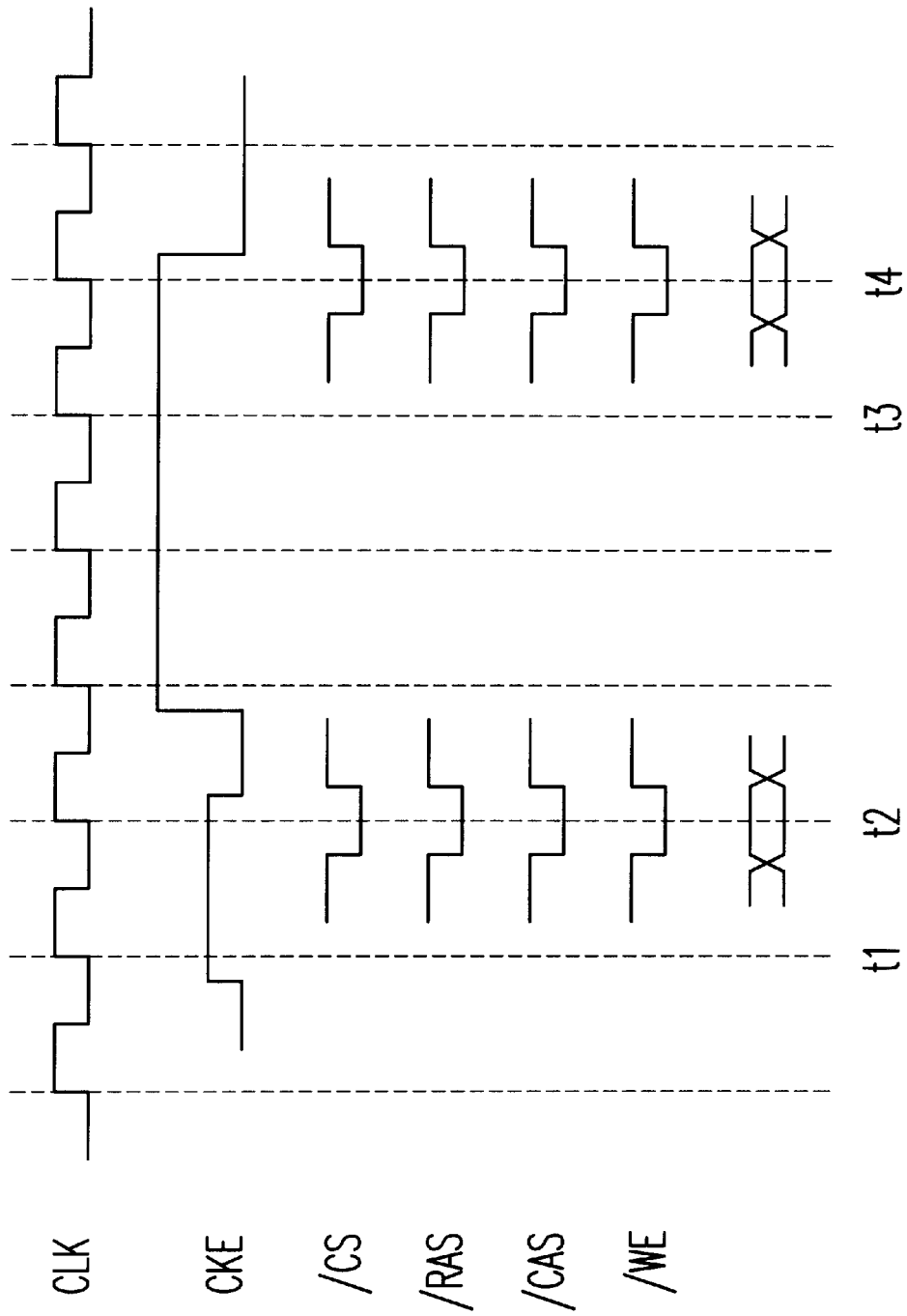
FIG. 3 is a mode setting timing diagram for explaining Fig. 2.

In FIG. 2, the setting operation of a mode register is performed by a write cas before ras signal wcbr at the rising edge of a clock as shown in the timing diagram of FIG. 3. The setting operation is also performed by the combination of addresses being input in this state.

Using a different method, a normal mode set is performed during the write cas before ras operation which is operation of a normal mode set command. In operation that potential of a specific pin is high potential that distinguish from potential of a supplying voltage together with such a command, a mode set related to a bank option can be performed (In FIG. 3, a cke pin is used in here).

The bank control circuit of FIG. 2 shows only a circuit that generate a bank address using an input address which is input to a resister (14). When the bank selection signal S3 is at a low state, four bank signals that are independently operated from each other are enabled to use both addresses. When the bank selection signal S3 at a high state, one of the mode addresses add 12 is compressed, whereby the residual address add 13 is used to select a bank.

Figure 5:
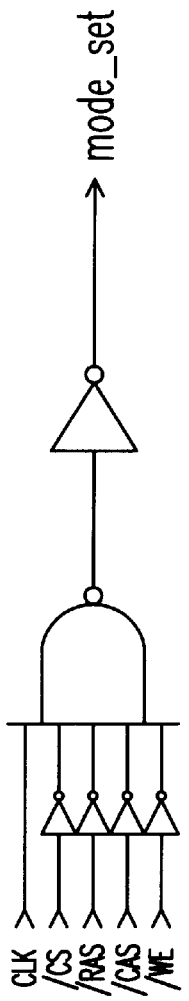
FIG. 5 is an example of a mode set control circuit of FIG. 2 and FIG. 4.

Reference 11 of FIG. 2 shows a mode set control portion and a detailed example thereof illustrated in FIG. 5. Reference 12 of FIG. 2 shows a special mode set control portion that performs a special mode set by detecting the potential of the cke pin and a detailed example thereof illustrated in FIG. 6.

FIG. 5 is the formation of the normal mode set using CLK, /CS, /RAS and /WE signal of FIG. 3 as an input. Two register 14, 14-1 in the operation mode register 6 are connected to one address buffer 5. During a normal mode set operation, information related to a mode is stored on the first register 14-1. During a special mode set operation, option information is stored on a second register 14.

Figure 6:
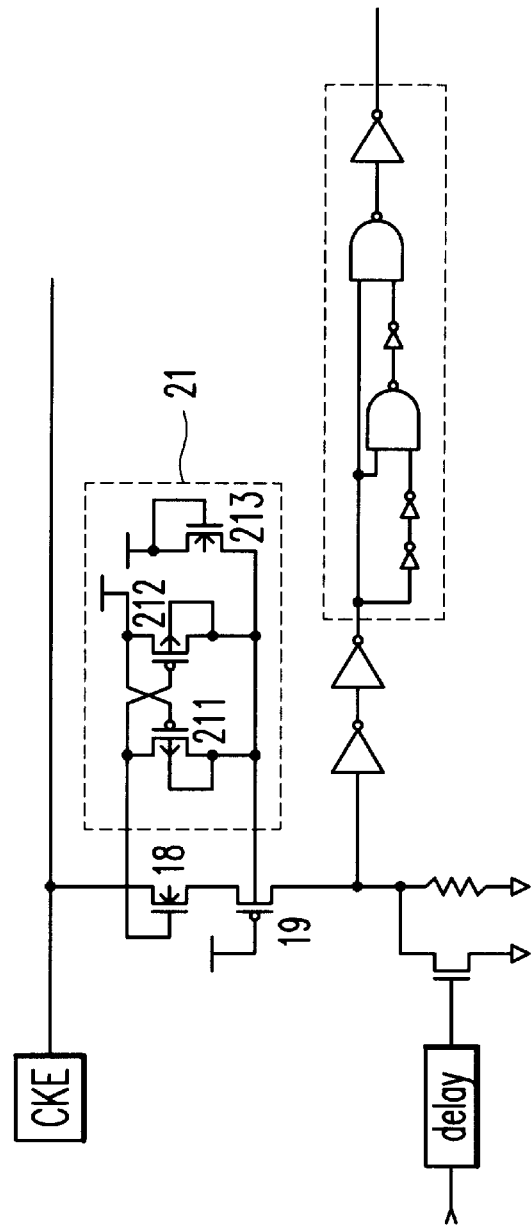
FIG. 6 is an example of a special mode set control circuit of FIG. 2 and FIG. 4.

FIG. 6 shows a high voltage detecting device to detect a specific potential between the supplying voltages being input a specific pin in a specifial mode control portion of a semiconductor device. The high voltage detecting device 21 has a first PMOS transistor 211, a second PMOS transistor 212 and an NMOS transistor 213. The first PMOS transistor is connected between a bias terminal of a PMOS transistor 19 and a gate terminal of a NMOS transistor 18. A gate electrode of the first PMOS transistor 211 is connected to a terminal to which voltage over the supplying voltage is input, an N-well bias terminal thereof is connected to the bias terminal of the PMOS transistor 19. A gate electrode of the PMOS transistor 19 is connected to the power supply terminal and the PMOS transistor is connected to a pad being input a high voltage. The second PMOS transistor 212 is connected between the power supply terminal and the bias terminal of a PMOS transistor 19, a gate electrode of the second PMOS transistor 212 is connected to the gate terminal of the NMOS transistor 18 and a N-well bias terminal thereof being connected to the bias terminal of a PMOS transistor 19. The NMOS transistor is connected between the terminal to which voltage over the supplying voltage is input and the bias terminal of a PMOS transistor 19. A gate electrode being connected to the terminal to which voltage over the supplying voltage is input.

Such a high voltage detecting device is used for applying a higher voltage between a power supply voltage and a high voltage to a N-well of a PMOS transistor so that a P-N diode formed between the N-well and a source terminal or a drain terminal of the PMOS transistor does not turn on during the supply of a high voltage.

Figure 4:
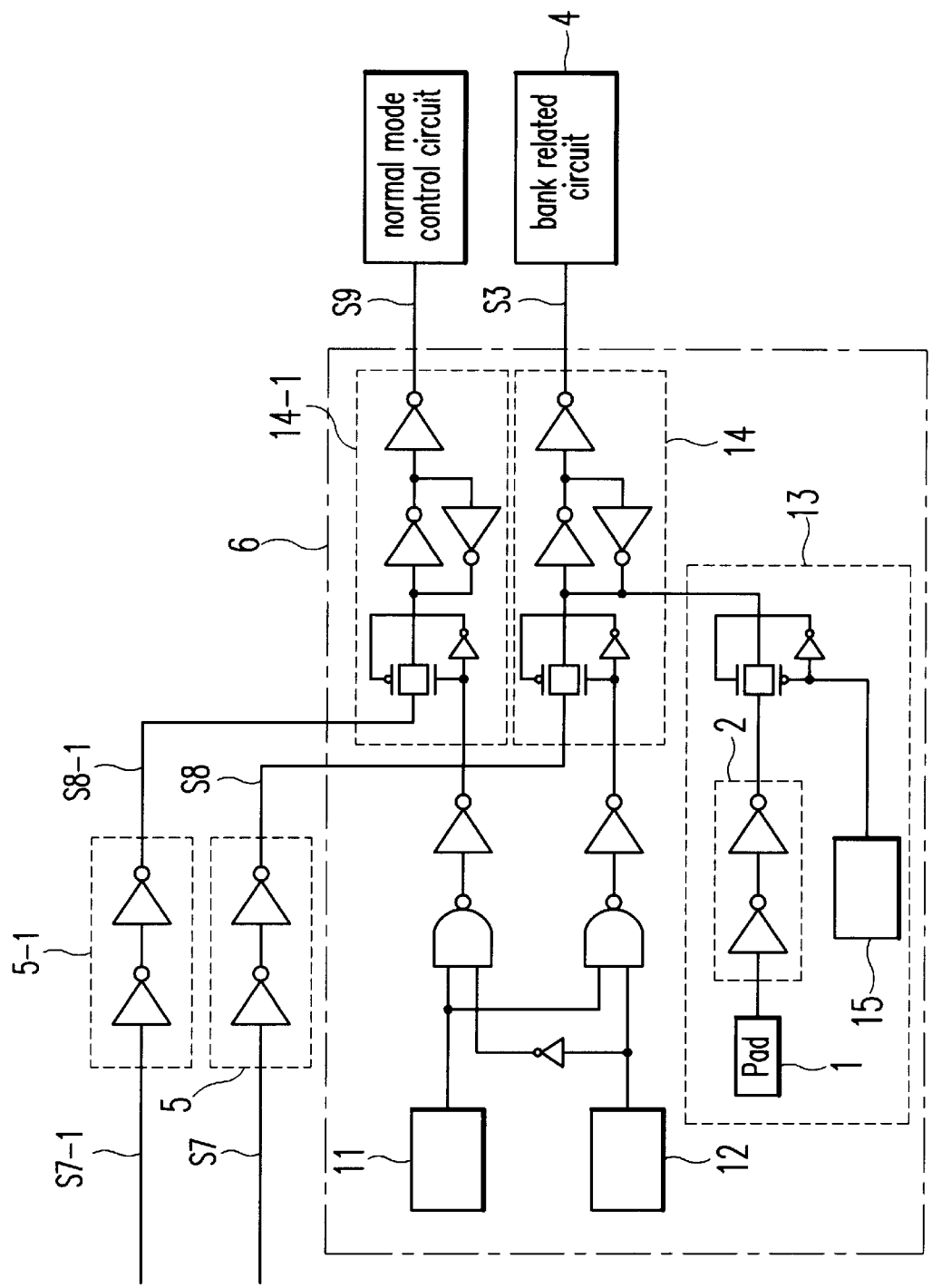
FIG. 4 is a bank selection circuit according to the second embodiment of the present invention.

FIG. 4 illustrates a synchronous memory device of a second embodiment of the present invention and shows that a first address is used in order to proceed a normal mode and a second address is used in order to proceed a special mode in FIG. 2.

The operation mode register 6 may have two external signal devices S7, S7-1 in addition to an initializing device 13 of FIG. 2 having an initial value. Accordingly, it is possible to perform a predetermined operation when a separate mode set operation is not performed. Here, an initial value can be controlled by the initializing device 13 as in the case of FIG. 2.

In FIG. 2, these initial values become a high state when the bonding option pad 1 is connected to the supplying voltage terminal, while the initial value becomes a low state when the bonding option pad 1 is connected to the ground.

Figure 7:
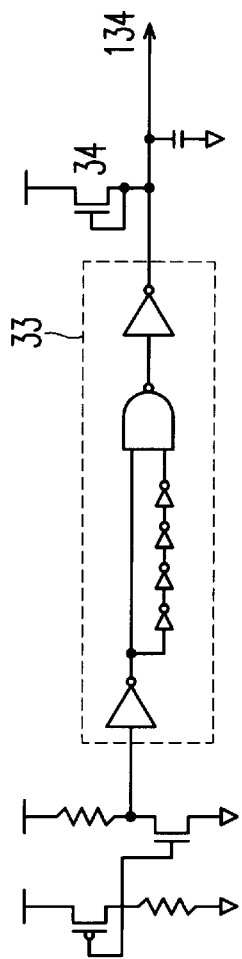
FIG. 7 is an example of a power on detection circuit of FIG. 2 and FIG. 4.

In order to become the initial value, a power on operation being applied with the supplying voltage must be detected. During this time, an initialize operation is performed. Such a power on detection device is shown in FIG. 7. In FIG. 7, a device detecting a power on includes a fuse circuit 33 which detect whether the supplying voltage reaches a specfic potential, an output terminal 134 which maintains a high potential when operated by an output signal of the fuse circuit 33 initializes a specific terminal at a low potential a switch element constructed between the output terminal 134 and a latch device in order to perform a reset operation when the power supply is cut off during operation of the output signal. This switch element must be turned on only when the operation is turned on. Also, the device includes an MOS transistor 34 that disables the potential of the power on output terminal when the supplying voltage is output. The NMOS transistor 34 is constructed between the power supply source and a gate thereof being connected to an output of the power on signal. The NMOS transistor 34 may be substituted by a PMOS transistor that is connected between the power supply terminal and the power on output terminal and a gate thereof is applied to the supplying voltage.

FIG. 7 shows an example of the power on detection device. The power on detection device enables normal operation to perform after the potential of the supplying voltage terminal reaches 2 vt. In a method of determining the initial value, as shown in FIG. 2, there is a method of using a bonding option. Also, there is a method of determining the initial value by a fuse cutting operation. Another method of determining the initial value during the manufacturing process may be used. Furthermore, a nonvolatile memory cell such as an EEPROM and a flash memory cell may be used to determining the initial value. Only this method deteriorates economical efficency.

Figure 8:
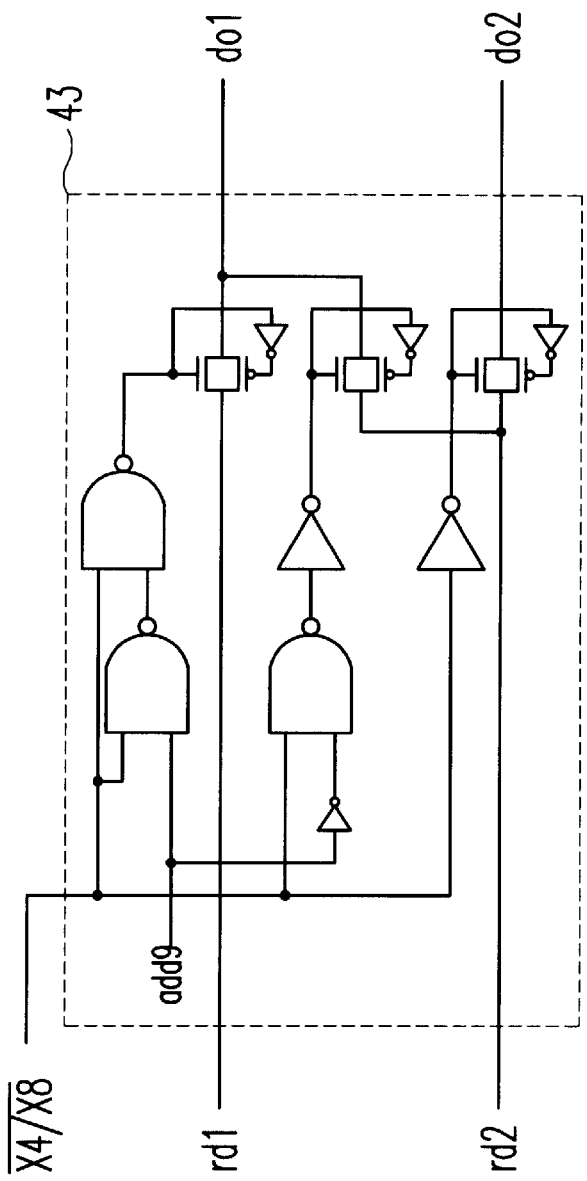
FIG. 8 is a data width control circuit that can substitute a bank relation circuit of FIG. 2.

FIG. 8 is a data width control circuit that can substitute the bank relation circuit of FIG. 2. This bank related circuit 4 may substitute another circuit, that is, it may be substituted to a data width control circuit that data width, number of input/output data, is changed to ×8 or ×16 from ×4.

Figure 9:
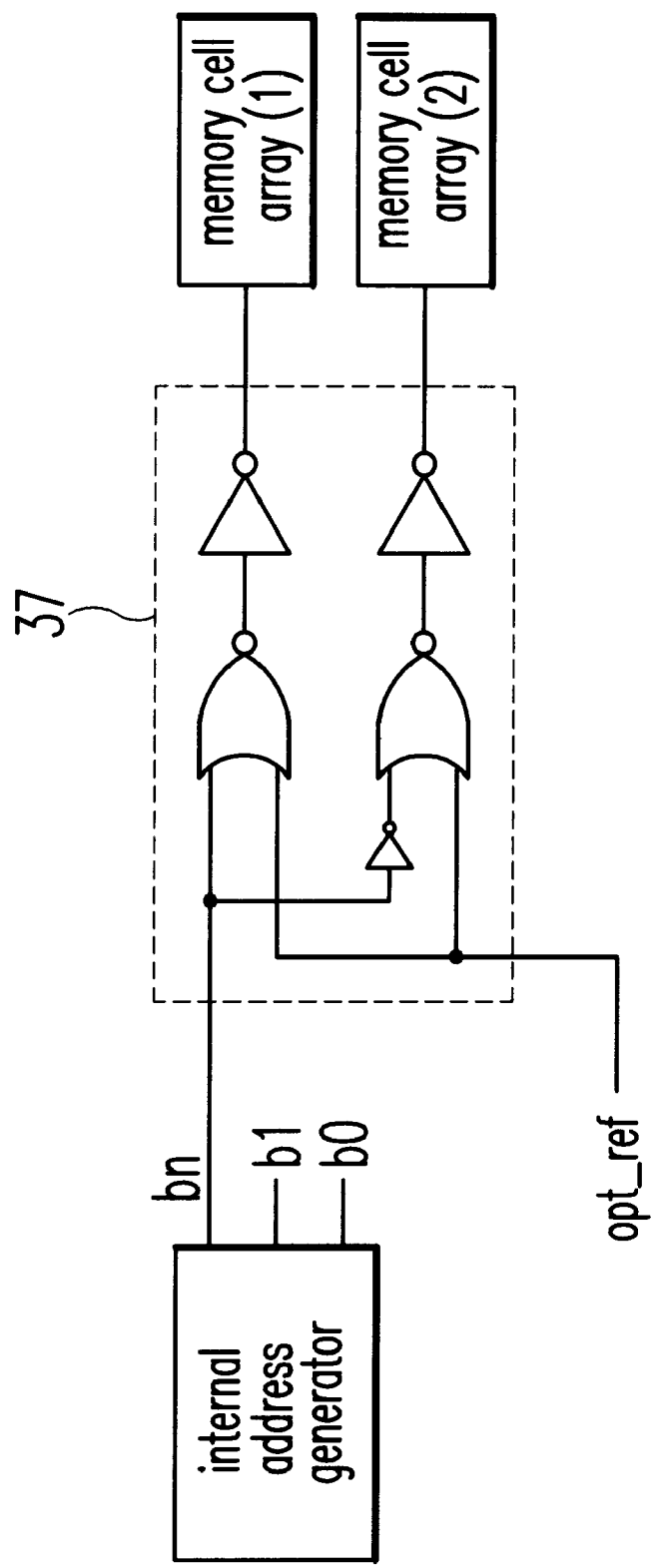
FIG. 9 is a refresh cycle control circuit that can substitute a bank relation circuit of FIG. 2.

Selectively, as shown in FIG. 9 illustrating a refresh cycle control circuit that can substitute a bank relation circuit of FIG. 2, in the case of a DRAM, it can use a circuit to control a signal showing a refresh period, the circuit connecting thereto.

If this invention is adapted to a SDRAM, it is possible to operate a circuit having banks of different number from each other using an identical design. Also, there is an effect in that the scope of use of the invention is widely used by easily changing a number of banks that are fixed in a conventional manufacturing process, a refresh cycle and a data width.

Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the spirit and scope of the invention.

What is claimed is:

1. A synchronous memory device in a semiconductor memory device comprising:

input means for receiving an external signal, wherein the input means is an address buffer used to select a cell during a normal operation;

operation mode memory means for latching and for outputting an output signal of said input means in response to input of an operation mode signal, the operation mode memory means including a mode register coupled to an output terminal of said input means;

mode register control means for controlling turn on and turn off operations, said mode register control means being connected to said mode register;

initializing means for pre-charging said mode register, said initializing means being connected to said mode register; and bank control means for generating one or more signals capable of selecting one or more banks using an output signal of said operation mode memory means.

2. The synchronous memory device of claim 1, wherein said mode register comprises:

first switching means for connecting the output terminal of said input means; and latching means for receiving the output signal of said input means when the first switching means is turned on, and for storing the output signal of said input means when the first switching means is turned off, said latching means being connected to said first switching means.

3. The synchronous memory device of claim 1, wherein said mode register control means is turned on when a RAS signal, a CAS signal and a write enable signal are synchronized with a clock signal, and input at a low state and enable a signal received by said input means to store on said mode register.

4. The synchronous memory device of claim 2, wherein said latching means have a predetermined initial value.

5. The synchronous memory device of claim 2, wherein said initializing means comprises:

a bonding option pad connected to a supplying voltage source or a ground;

second switching means for connecting between an output terminal of said bonding option pad and said latching means; and a power on detection means for enabling said second switching means to turn on during "power on" operation of a device.

6. A synchronous memory device in a semiconductor memory device comprising:

input means for receiving an external signal, wherein the input means is an address buffer used to select a cell during a normal operation;

operation mode memory means for latching and for outputting an output signal of said input means in response to input of an operation mode signal; the operation mode memory means including a mode register coupled to an output terminal of said input means;

mode register control means for controlling turn on and turn off operations, said mode register control means being connected to said mode register;

initializing means for pre-charging said mode register, said initializing means being connected to said mode register; and data width control means for controlling the number of data being input and output at the same time using an output signal of said operation mode means.

7. The synchronous memory device of claim 6, wherein said mode register comprises:

first switching means for connecting the output terminal of said input means; and latching means for receiving the output signal of said input means when the first switching means is turned on, and for storing the output signal of said input means when the first switching means is turned off, said latching means being connected to said first switching means.

8. The synchronous memory device of claim 6, wherein said mode register control means is turned on when a RAS signal, a CAS signal and a write enable signal are synchronized with a clock signal and input at a low state and enable signal received by said input means to store on said mode register.

9. The synchronous memory device of claim 7, wherein said latching means have a predetermined initial value.

10. The synchronous memory device of claim 7, wherein said initializing means comprises:
   a bonding option pad being connected to a supplying voltage source or a ground;
   second switching means for connecting between an output terminal of said bonding option pad and said latching means; and
   a "power on" detection means for enabling said second switching means to turn on during "power on" operation of the device.

11. A synchronous memory device in a semiconductor memory device comprising:
   input means for receiving an external signal, wherein the input means is an address buffer used to select a cell during a normal operation;
   operation mode memory means for latching and for outputting an output signal of said input means in response to input of an operation mode signal, the operation mode memory means including
      a mode register coupled to an output terminal of said input means;
      mode register control means for controlling turn on and turn off operations, said mode register control means being connected to said mode register;
      initializing means for pre-charging said mode register, said initializing means being connected to said mode register; and
   refresh cycle control means for controlling the number of refresh cycles in cell during refresh operation using an output signal of said operation mode memory means.

12. The synchronous memory device of claim 11, wherein said mode register comprises:
   first switching means for connecting an output terminal of said input means; and
   latching means for receiving the output signal of said input means when the first switching means is turned on, and for storing the output signal of said input means when the first switching means is turned off, said latching means being connected to said first switching means.

13. The synchronous memory device of claim 11, wherein said mode register control means is turned on when a RAS signal, a CAS signal and a write enable signal are synchronized with a clock signal and input at a low state and enable a signal received by said input means to store on said mode register.

14. The synchronous memory device of claim 12, wherein said latching means have a predetermined initial value.

15. The synchronous memory device of claim 12, wherein said initializing means comprises:
   a bonding option pad being connected to a supplying voltage source or a ground; second switching means for connecting between an output terminal of said bonding option pad and said latching means; and
   a "power on" detection means for enabling said second switching means to turn on during "power on" operation of the device.

* * * * *